(12) United States Patent
Hutin et al.

(10) Patent No.: US 11,799,396 B2
(45) Date of Patent: Oct. 24, 2023

(54) NANOMETRIC ELECTROMECHANICAL ACTUATOR AND METHOD OF MANUFACTURING THE SAME

(71) Applicant: COMMISSARIAT A L'ENERGIE ATOMIQUE ET AUX ENERGIES ALTERNATIVES, Paris (FR)

(72) Inventors: Louis Hutin, Grenoble (FR); Giulia Usai, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 145 days.

(21) Appl. No.: 17/305,727

(22) Filed: Jul. 14, 2021

(65) Prior Publication Data

US 2022/0021315 A1 Jan. 20, 2022

(30) Foreign Application Priority Data

Jul. 16, 2020 (FR) ...................... 20 07485

(51) Int. Cl.
*H02N 1/00* (2006.01)
*B82B 1/00* (2006.01)
*B82B 3/00* (2006.01)

(52) U.S. Cl.
CPC ............ *H02N 1/006* (2013.01); *B82B 1/002* (2013.01); *B82B 3/0023* (2013.01)

(58) Field of Classification Search
CPC ...... H02N 1/006; B82B 1/002; B82B 3/0023; B81C 1/00626; B81C 1/0015; B81B 2201/014; H01H 1/0036
See application file for complete search history.

(56) References Cited

U.S. PATENT DOCUMENTS

| 6,580,138 | B1 | 6/2003 | Kubena et al. | |
| 7,528,691 | B2 * | 5/2009 | Wallis | H01H 59/0009 335/78 |
| 8,809,135 | B2 * | 8/2014 | Sawyer | B81B 7/0048 216/2 |

(Continued)

FOREIGN PATENT DOCUMENTS

| EP | 2 138 452 A1 | 12/2009 |
| WO | WO 02/10063 A2 | 2/2002 |
| WO | WO 02/10063 A3 | 2/2002 |

OTHER PUBLICATIONS

French Preliminary Search Report dated Mar. 26, 2021 in French Application 20 07485 filed on Jul. 16, 2020, 10 pages (with English Translation of Categories of Cited Documents & Written Opinion).

(Continued)

*Primary Examiner* — Yasser A Abdelaziez
(74) *Attorney, Agent, or Firm* — Oblon, McClelland, Maier & Neustadt, L.L.P.

(57) ABSTRACT

A method for manufacturing an electromechanical actuator includes providing a primary stack of layers comprising a monocrystalline layer, providing a secondary stack of layers, and forming, in the etching layer, at least three pads. The method further includes encapsulating the three pads by a first encapsulation layer, assembling the primary stack of layers with the secondary stack of layers, removing the first substrate, and forming a movable electrode in the monocrystalline layer.

12 Claims, 11 Drawing Sheets

(56) References Cited

U.S. PATENT DOCUMENTS

| | | |
|---|---|---|
| 2003/0141562 A1 | 7/2003 | Kubena et al. |
| 2009/0317931 A1 | 12/2009 | Perruchot et al. |
| 2016/0130138 A1* | 5/2016 | Bulovic .............. B81C 1/00634 |
| | | 438/32 |

OTHER PUBLICATIONS

Durand et al., "Silicon on nothing MEMS electromechanical resonator", Microsyst Technol, 2008, 14, pp. 1027-1033.

Barraud et al., "Vertically Stacked-Nano Wires MOSFETs in a Replacement Metal Gate Process with Inner Spacer and SiGe Source/Drain", IEDM16, IEEE Xplore, 2016, pp. 464-467.

Hung et al., "Silicide-Based Release of High Aspect-Ratio Microstructures", IEEE Xplore, 2010, pp. 120-123.

Kwon et al., "Electro-Mechanical Diode Performance and Scaling for Cross-Point Non-Volatile Memory Arrays", IEEE, 2012, 4 pages.

Lee et al., "A sub-1-volt nanoelectromechanical switching device", Nature Nanotechnology, vol. 8, Jan. 2013, pp. 36-40.

Caubet et al., "Mechanisms of isotropic and selective etching between SiGe and Si", Journal of Vacuum Science & Technology, 2006, 8 pages.

Salvetat et al., "Comparison Between Three $Si_{1-x}Ge_x$ versus Si Selective Etching Processes", ECS Transactions, 16 (10), 2008, 12 pages.

\* cited by examiner

NANOMETRIC ELECTROMECHANICAL ACTUATOR AND METHOD OF MANUFACTURING THE SAME

DOMAIN OF THE INVENTION

The present invention concerns the field of Nano Electro-Mechanical Systems otherwise called NEMS. It finds a particularly advantageous application in the field of electromechanical actuators activated by an electrostatic force.

TECHNOLOGICAL BACKGROUND

There are many nano-devices designed to replace conventional transistors in some applications. Indeed, the NEMS have many advantages for some technical applications such as telecommunications for example.

There are almost as many methods as there are types and morphologies of NEMS. Indeed, it is really a high-precision work that it is necessary to implement to make these devices.

Also, for example, the document "Silicon on nothing MEMS electromechanical resonator, Durand et al., Microsyst Technol 2008, 14: 1027-1033" is known which describes an electromechanical actuator comprising an epitaxial silicon membrane suspended from several of the ends thereof above a silicon substrate. The distance between these two elements is then 100 nm and is obtained by removing an interlayer located between these two elements and used for the growth of the epitaxial silicon layer.

The method used and the obtained device have many drawbacks. On the one hand, the method does not allow effectively removing all the interlayer located under the silicon layer, and on the other hand, the space requirement of this device is large due to the fact that the membrane is kept in suspension in several points. Finally, the membrane is made of epitaxial silicon which is therefore not a monocrystalline layer, thereby reducing the electromechanical performance thereof.

An object of the present invention is therefore to propose a method and a device at least partially responding to these problems and providing an improvement in the design of a nano-electromechanical actuator.

The other objects, features and advantages of the present invention will become apparent on examining the following description and the appended drawings. It is understood that other advantages can be incorporated.

SUMMARY

In order to achieve this objective, according to one embodiment a method for manufacturing an electromechanical actuator, preferably nano-electromechanical actuator, is provided, comprising a fixed actuation electrode, a fixed contact electrode and a movable electrode, the actuator further comprising a stack of layers, the movable electrode comprising an anchoring portion secured to the stack of layers and a movable portion configured to have a rest position and a contact position, the rest position corresponding to an absence of contact between the movable portion of the movable electrode and the fixed contact electrode, the contact position corresponding to a contact between the movable portion of the movable electrode and the fixed contact electrode when a non-zero bias is applied between the movable electrode and the fixed actuation electrode, said method comprising the following steps:

a) Providing a primary stack of layers comprising:
 i. A first substrate;
 ii. A monocrystalline layer disposed on an upper surface of the first substrate;
 iii. An interlayer disposed on an upper surface of the monocrystalline layer;
 iv. An etching layer disposed on an upper surface of the interlayer;
b) Providing a secondary stack of layers comprising:
 i. A second substrate;
 ii. A transfer layer disposed on an upper surface of the second substrate;
c) Forming by etching, in the etching layer, at least three pads, selectively at the interlayer;
d) Encapsulating the three pads by a first encapsulation layer;
e) Assembling the primary stack of layers with the secondary stack of layers by bonding at least one portion of the exposed surface of the first encapsulation layer with at least one portion of the exposed surface of the transfer layer so as to form a bonding interface;
f) Removing the first substrate;
g) Forming by etching the anchoring portion and the movable portion of the movable electrode in the monocrystalline layer;
h) Removing a sacrificial portion of the interlayer configured to release the movable portion of the movable electrode and so as to preserve a portion of the interlayer between the anchoring portion of the movable electrode and at least one portion of one of the three pads;

This allows making an electromechanical actuator whose movable element is monocrystalline. This allows improving the electromechanical response of the actuator.

The monocrystallinity of the movable electrode allows a better control of the bias voltages necessary for the displacement thereof.

The bonding allows using of various substrates and thus various types of monocrystalline materials if desired.

This also allows making an electromechanical actuator having a reduced gap relative to the prior art.

Another aspect concerns an actuator comprising at least one fixed actuation electrode, a fixed contact electrode and a movable electrode, the actuator comprising at least one stack of layers, the movable electrode comprising at least one anchoring portion secured to the stack of layers and a movable portion configured to have a rest position and a contact position, the rest position corresponding to an absence of contact between the movable portion of the movable electrode and the fixed contact electrode, the contact position corresponding to a contact between the movable portion of the movable electrode and the fixed contact electrode when a non-zero bias is applied between the movable electrode and the fixed actuation electrode, wherein the movable electrode is formed of a monocrystalline material and in that the anchoring portion is secured to the stack of layers through an interlayer.

BRIEF DESCRIPTION OF THE FIGURINGS

The aims, objects, and the features and advantages of the invention will become more apparent from the detailed description of an embodiment thereof which is illustrated by the following appended drawings in which.

Figure 1:
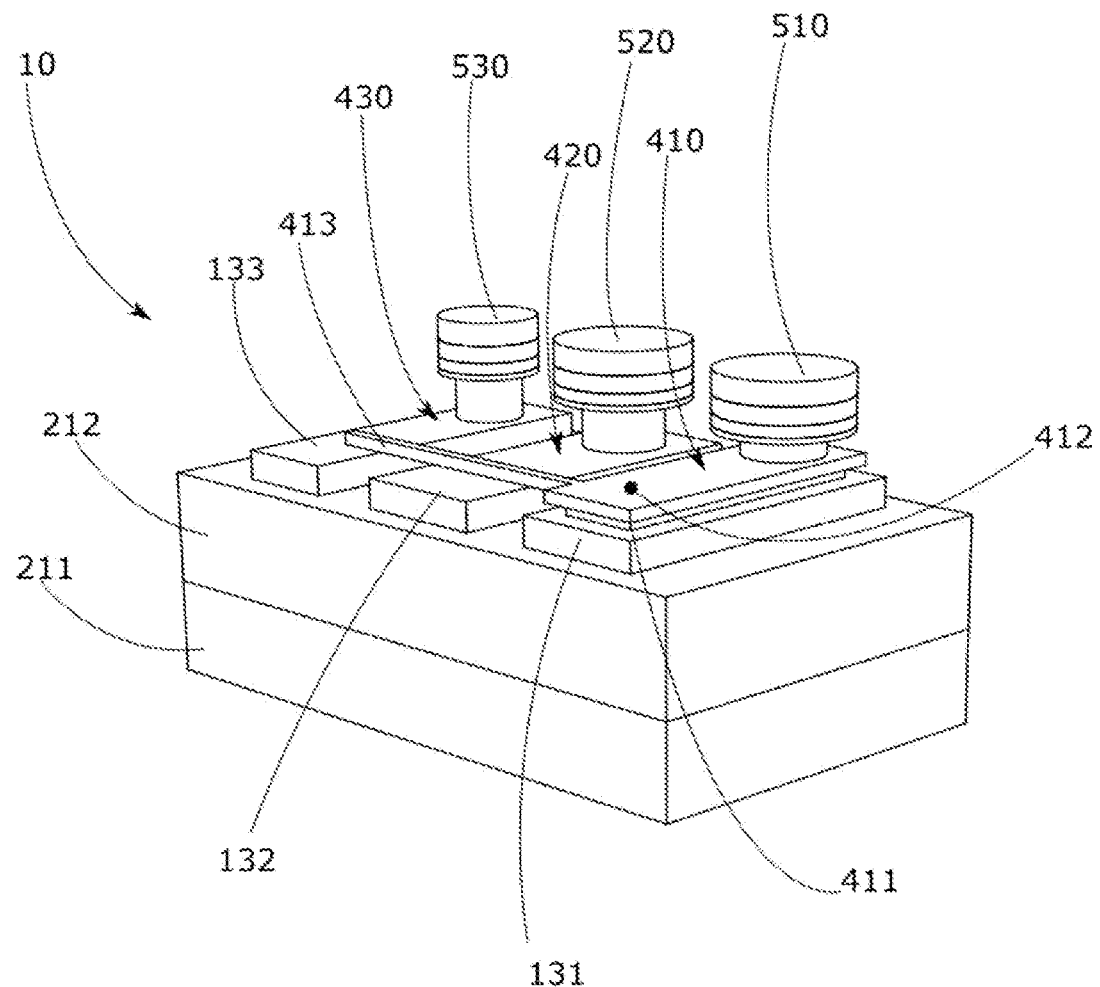
FIG. 1 represents a nano-electromechanical actuator according to an embodiment of the present invention.

The drawings are given by way of example and are not limiting of the invention. They constitute schematic representations of principle intended to facilitate the understanding of the invention and are not necessarily on the scale of the practical applications. In particular, the dimensions are not representative of reality.

DETAILED DESCRIPTION

Before starting a detailed review of embodiments of the invention, optional features are listed below which may possibly be used in combination or alternatively:

According to one example, the monocrystalline layer is based on and/or comprises at least one material taken from: a semiconductor, an electrical conductor.

According to one example, the etching layer is a monocrystalline layer.

According to another example, the etching layer is an epitaxial layer.

According to another example, the etching layer is a polycrystalline layer.

According to another example, the etching layer is an amorphous layer.

According to one example, the crystal structure of the monocrystalline layer is different from the crystal structure of the etching layer.

According to one example, the monocrystalline layer and the etching layer are based on the same material.

According to one example, the etching layer is obtained by epitaxial growth of a material identical to the material composing the monocrystalline layer and from the interlayer.

According to one example, the interlayer has a thickness dimension which is less than or equal to the thickness dimension of the monocrystalline layer, the thickness dimensions being taken according to an axis orthogonal to the main extension dimension of the considered layers.

According to one example, the monocrystalline layer is based on monocrystalline silicon, the interlayer is based on silicon and germanium and the etching layer is silicon-based.

According to one example, the bonding is a molecular bonding.

According to one example, the method comprises, before the assembly step, a step of planarising the exposed surface of the first encapsulation layer so as to at least partially expose one surface of at least one of the three pads, and the bonding interface is at least partially formed of one portion of the surface one of the three pads, at least one portion of the exposed surface of the first encapsulation layer and at least one portion of the exposed surface of the transfer layer.

According to one example, the step of removing a portion of the interlayer comprises at least one wet or anhydrous etching configured to remove a sacrificial portion of the interlayer supporting the movable portion of the movable electrode.

According to one example, the method comprises a step of forming at least one electrical contact for each pad.

According to one example, the movable portion of the movable electrode is suspended by the anchoring portion of the movable electrode above at least one portion of the fixed actuation electrode in the rest position, the distance separating the movable portion and the portion of the fixed actuation electrode is less than 20 nm, preferably less than 15 nm and advantageously equal to 12 nm in the rest position.

According to one example, the actuator comprises at least one bonding interface resulting from the bonding of a primary stack of layers with a secondary stack of layers.

It is specified within the scope of the present invention, the term "on", "overcomes", "covers" or "underlying" or the equivalents thereof do not mean "in contact with". Thus, for example, the deposition of a first layer on a second layer does not necessarily mean that the two layers are directly in contact with each other, but it does mean that the first layer at least partially covers the second layer by being either directly in contact therewith or by being separated therefrom by at least one other layer or at least one other element.

In the present patent application, the thickness is taken in a direction perpendicular to the main faces of the substrate on which the different layers lie. In the figures, the thickness is taken along the vertical.

The present invention concerns a nano-electromechanical actuator and the manufacturing method thereof. This device advantageously has a gap which is less than 50 nm, which allows it a greater reactivity. Likewise, this device has a monocrystalline movable electrode, which allows herein further increasing the reactivity, the reliability and the durability of the device. These advantages are made partially possible by the configuration of the device and by the manufacturing method thereof.

FIG. 1 represents, according to an embodiment of the present invention, a nano-electromechanical actuator 10. This actuator 10 comprises three electrical contacts 510, 520 and 530, each connected to a pad 131, 132 and 133. Each electrical contact/pad assembly forms an electrode 410, 420 and 430. This device 10 then comprises a fixed contact electrode 430, a fixed actuation electrode 420 and a movable electrode 410.

This movable electrode 410 comprises an anchoring portion 412 secured to a pad 131 and an electrical contact 510 through an interlayer 411. This movable electrode 410 comprises a movable portion 413, preferably in the form of a beam suspended above the other two pads 132 and 133. This movable electrode 410 is configured to advantageously have two positions, a position called rest position and a position called contact position. The rest position corresponds to an absence of contact between the movable portion 413 of the movable electrode 410 and the fixed contact electrode 430. The contact position corresponds to a contact between the movable portion 413 of the movable electrode 410 and the fixed contact electrode 430 when a non-zero bias is applied between the movable electrode 410 and the fixed actuation electrode 420. The electrostatic force then exerted on the movable portion 413 of the movable electrode 410 inclines the latter to the point that it comes into electrical contact with the fixed contact electrode 430.

It will be noted in particular that according to an embodiment illustrated in FIG. 1, the fixed actuation electrode 420 is disposed between the fixed contact electrode 430 and the anchoring portion of the movable electrode 410. In this configuration, and advantageously, it is the free end of the beam of the movable portion 413 of the movable electrode 410 which is configured to at least partially come in electrical contact with the fixed contact electrode 430 in the contact position.

These three electrodes 410, 420 and 430 are supported by a stack of layers called secondary layers 200 comprising a substrate, called second substrate 211 hereinafter, and a transfer layer 212.

According to a preferred embodiment, this transfer layer 212 comprises a bonding interface 142 located between the three pads 131, 132 and 133 and the second substrate 212 as will be described below.

Figure 25:
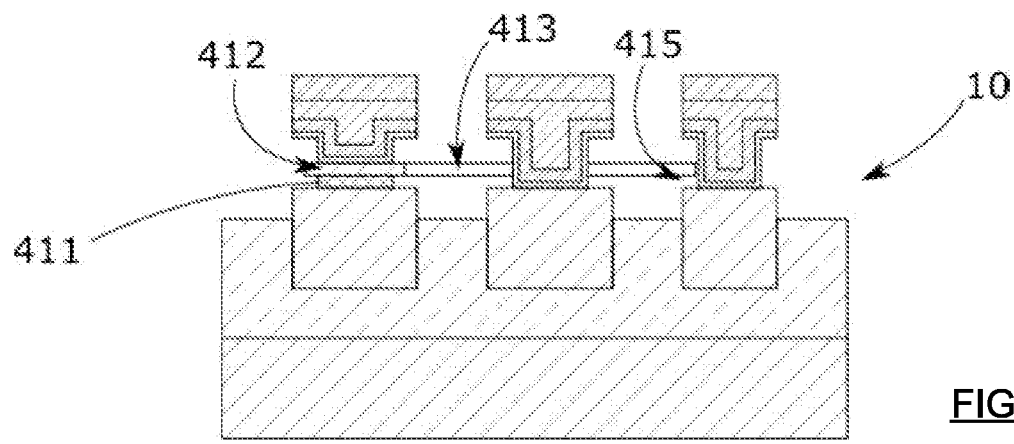
FIG. 25 represents a step of removing the portion of the interlayer located under the movable portion of the movable electrode so as to form a gap between this movable portion and the other two electrodes according to one embodiment of the present invention.

In this Figure as well as in FIG. 25, the gap 415 will be noted, that is to say the distance located between the movable portion 413 of the movable electrode 410 and the pad 133 of the contact electrode 430 when the movable electrode 410 is in the rest position. Preferably, the upper surface of the pads 132 and 133 are coplanar thus defining a constant gap 415 between the movable portion 413 of the movable electrode 410 and both the upper surface of the pad 132 and the upper surface of the pad 133 of the other two electrodes 420 and 430. This gap 415 is preferably equal to the thickness dimension of the interlayer 411. This interlayer 411 is preferably based on silicon-germanium (SiGe). This gap 415 is advantageously less than 20 nm, preferably less than 15 nm and preferably equal to 12 nm.

Figure 2:
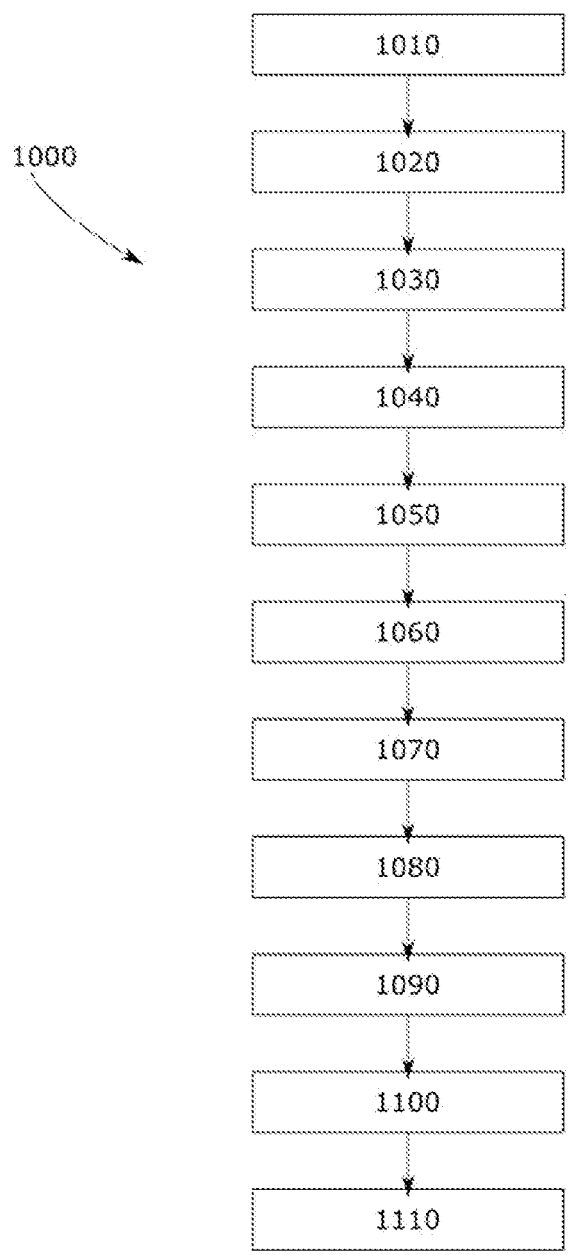
FIG. 2 represents a portion of the steps of a method for manufacturing a nano-electromechanical actuator according to an embodiment of the present invention.

FIG. 2 illustrates a schematic representation of an embodiment of method 1000 according to the present invention.

According to one embodiment, the manufacturing method 1000 comprises at least the following steps:
a) Providing 1010 a primary stack of layers 100 comprising:
   i. A first substrate 110;
   ii. A monocrystalline layer 120 disposed on an upper surface of the first substrate 110;
   iii. An interlayer 411 disposed on an upper surface of the monocrystalline layer 120;
   iv. An etching layer 130 disposed on an upper surface of the interlayer 411;
b) Providing 1020 a secondary stack of layers 200 comprising:
   i. A second substrate 211;
   ii. A transfer layer 212 disposed on an upper surface of the second substrate 211;
c) Forming 1030, preferably by etching, at least three pads 131, 132, 133 in the first etching layer 130, selectively at the interlayer 411;
d) Encapsulating 1040 the three pads 131, 132, 133 by a first encapsulation layer 140;
e) Preferably, planarising 1050 the exposed surface 141 of the first encapsulation layer 140;
f) Assembling 1060 the primary stack of layers 100 with the secondary stack of layers 200 by bonding at least one portion of the exposed surface 141 of the first encapsulation layer 140 with the exposed surface 213 of the transfer layer 212 so as to form a bonding interface 214;
g) Removing 1070 the first substrate 100 so as to expose at least one portion of the monocrystalline layer 120;
h) Forming 1080 by etching the anchoring portion 412 and the movable portion 413 of the movable electrode 410 in the monocrystalline layer 120;
i) Preferably, removing 1090 a portion of the interlayer 411 so as to keep the interlayer 411 at least under the movable electrode 410, said interlayer 411 thus forming a support layer for the movable electrode 410 and in particular for the anchoring portion 412 and the movable portion 413 of the movable electrode 410;

j) Removing 1100 a sacrificial portion 414 of the interlayer configured to release the movable portion 413 of the movable electrode 410 and so as to preserve one of the interlayer 411 between the anchoring portion 412 and at least one portion of one of the three pads 131;

k) Preferably, before or after forming 1080 the anchoring portion 412 and the movable portion 413 of the movable electrode 410, forming 1110 electrical contacts 510, 520 and 530 above at least one portion of each of the three pads 131, 132 and 133.

This method 1000 cleverly allows obtaining the previously presented device 10 comprising a monocrystalline movable electrode 410 height-wise spaced from the fixed contact 430 and actuation 420 electrodes by a very small distance relative to the prior art, a distance commonly called gap 415. As described below, it is at least partly by the bonding step 1060 and the use of a wet or anhydrous etching 1100 that this device 10 can thus be manufactured.

Figure 3:
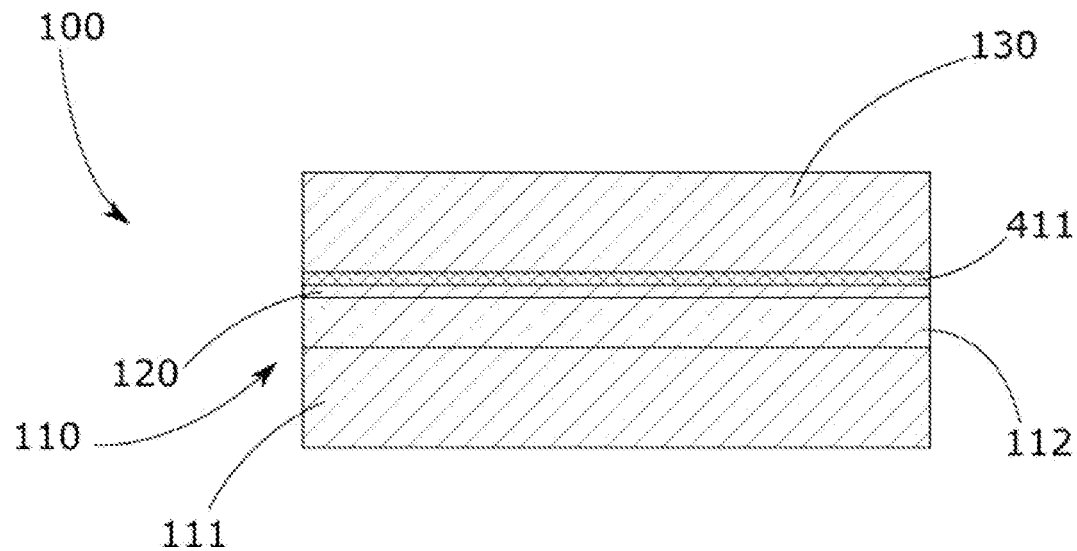
FIG. 3 represents a primary stack of layers according to an embodiment of the present invention.

FIG. 3 represents the primary stack of layers 100. The first substrate 110 preferably comprises at least one support layer 111 and an interface layer 112.

The support layer 111 is preferably made from a semiconductor material and in particular based on silicon.

The interface layer 112 is advantageously based on a dielectric material, for example a nitride or a semiconductor oxide, and preferably silicon oxide.

The monocrystalline layer 120 is preferably based on monocrystalline silicon. The monocrystalline layer 120 may have a thickness dimension of less than 20 nm, preferably less than 15 nm and advantageously equal to 12 nm.

Preferably, the term "monocrystalline" means a material or a layer having a homogeneous and continuous crystalline structure, preferably without grain boundaries. It should be noted in particular that an epitaxial layer is not considered as a monocrystalline layer in the present description.

The interlayer 411 is preferably based on SiGe. The interlayer 411 may have a thickness dimension less than 20 nm, preferably less than 15 nm and advantageously equal to 12 nm.

According to a preferred embodiment, the etching layer 130 is preferably based on an epitaxial material. This allows reducing the introduction of mechanical stresses into the stack of primary layers 100. According to this embodiment, the etching layer 130 is an epitaxial layer, and not monocrystalline.

According to another embodiment, the etching layer 130 is monocrystalline.

Preferably, the etching layer 130 is based on silicon, advantageously epitaxial or monocrystalline. It should be noted that the embodiment in which the etching layer 130 is monocrystalline allows avoiding the presence of mechanical stresses in the stack of primary layers 100.

The etching layer 130 may have a thickness dimension greater than 20 nm, preferably greater than 50 nm and advantageously equal to 100 nm.

According to one embodiment, the etching layer 130 is doped so as to make it electrically conductive or more conductive. This allows reducing the electrical resistivity of the etching layer 130, for example in the case where the latter would be based on a semiconductor or even insulating material. This thus allows reducing the propagation delay of an electrical signal passing through the etching layer 130.

According to one embodiment, the etching layer 130 is based on the same material as the monocrystalline layer 120, and the crystallographic structure of the etching layer 130 is different from the crystallographic structure of the monocrystalline layer 120. The term "different crystallographic structure" means, for example, the fact that the crystallographic orientation and/or the lattice parameters and/or the impurity level are different between two layers of the same material.

Figure 4:
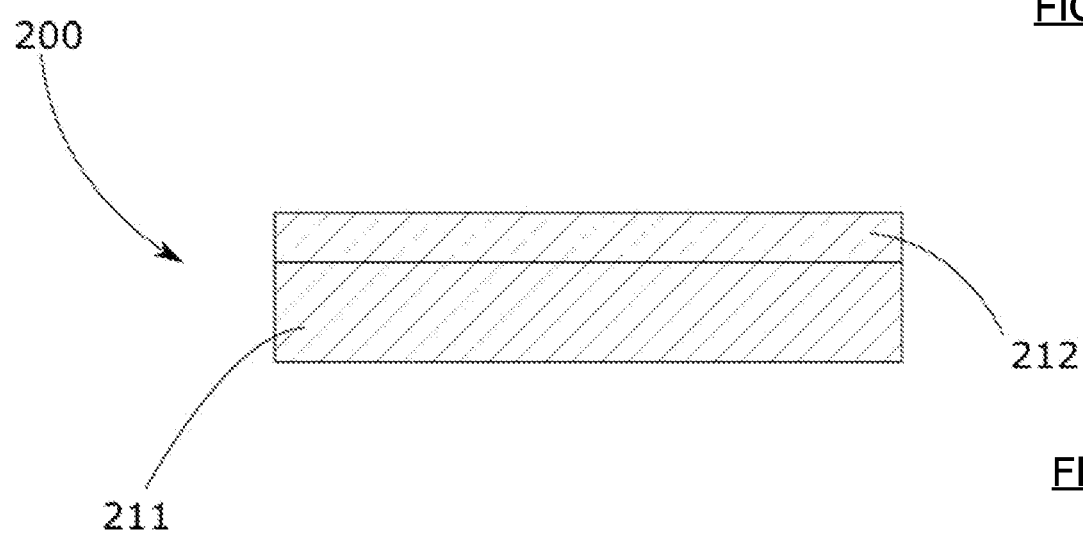
FIG. 4 represents a secondary stack of layers according to an embodiment of the present invention

FIG. 4 represents the secondary stack of layers 200.

The second substrate 211 is preferably based on silicon, advantageously monocrystalline.

The transfer layer 212 is preferably based on a dielectric material. The transfer layer 212 is advantageously based on silicon oxide.

The transfer layer 212 has a thickness dimension greater than 50 nm, preferably greater than 150 nm and advantageously equal to 400 nm.

Figure 5:
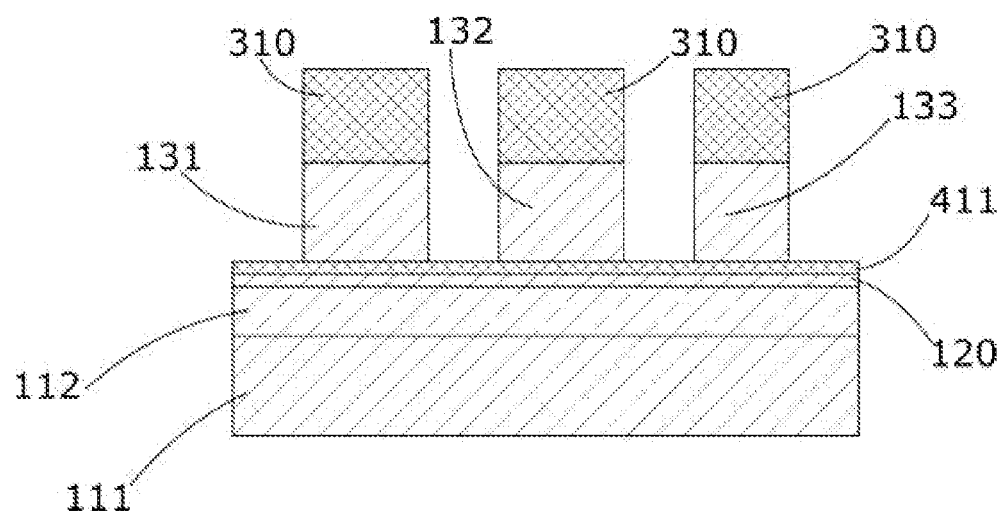
FIG. 5 represents the production of pads according to an embodiment of the present invention.
Figure 6:
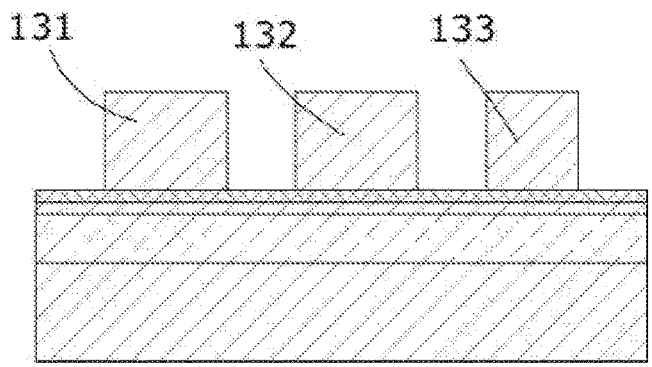
FIG. 6 represents three pads produced according to an embodiment of the present invention.

FIGS. 5 and 6 represent the step 1030 of forming the three pads 131, 132 and 133 in the etching layer 130. It will be noted that this step comprises the arrangement of a first etching mask 310 on at least one portion of the exposed surface of the etching layer 130 so as to define the three pads 131, 132 and 133 to be formed. Preferably, the term "etching mask" means any resin layer or any solid mask used to protect one or more portion(s) of a layer or of several layers during an etching.

This step 1030 comprises an etching of the etching layer 130. Preferably, the etching continues until exposing at least one portion of the interlayer 411 located between each pad 131, 132 and 133 thus formed.

According to one embodiment, this etching may comprise a plasma etching based on a $Cl_2/HBr$ chemistry.

According to another embodiment, this etching may include an etching based on $CF_4/N_2$ and $O_2$.

It will be noted that the three pads 131, 132 and 133 have a substantially equal thickness dimension. It will also be noted that the first pad 131 has a width extension dimension greater than that of the second pad 132, and that the second pad 132 has a width extension dimension greater than that of the third pad 133.

Advantageously, the first pad 131 is configured to support the anchoring portion 412 of the movable electrode 410. The second pad 132 is preferably configured to at least partially form the fixed actuation electrode 420. Preferably, the third pad 133 is configured to at least partially form the fixed contact electrode 430.

Figure 7:
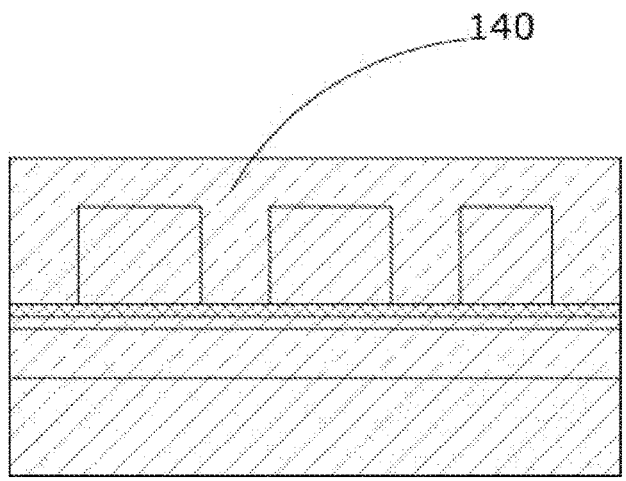
FIG. 7 represents a step of encapsulating the three pads according to an embodiment of the present invention.

FIG. 7 represents the encapsulation step 1040 by the first encapsulation layer of the three pads 131, 132 and 133 thus formed. The first encapsulation layer 140 is preferably based on a dielectric material, advantageously based on silicon oxide. It will be noted that the thickness dimension of the first encapsulation layer 140 is greater than the thickness dimension of each pad 131, 132 and 133.

Figure 8:
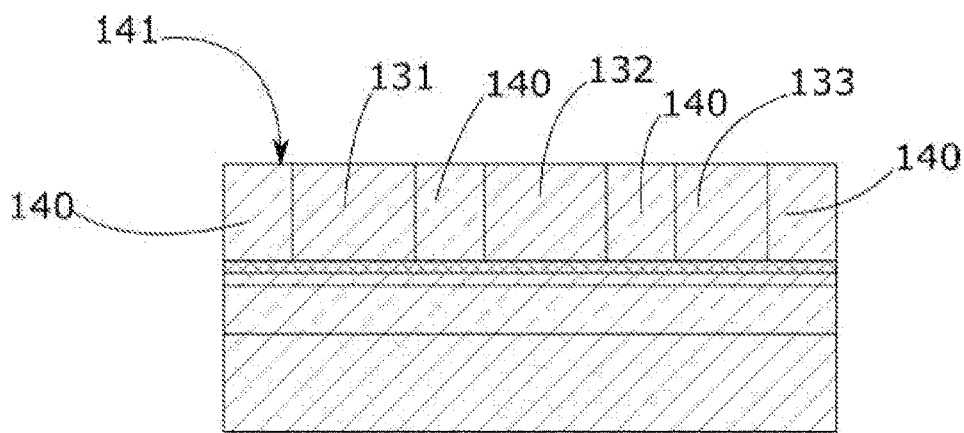
FIG. 8 represents a step of planarising the encapsulation layer of FIG. 7 according to an embodiment of the present invention.

FIG. 8 represents a planarization step 1050 of planarising the exposed surface 141 of the first encapsulation layer. The planarisation 1050 can be carried out until exposing at least one portion of the three pads 131, 132 and 133 according to one embodiment. This planarisation step 1050 can use a chemical mechanical planarisation method.

Figure 9:
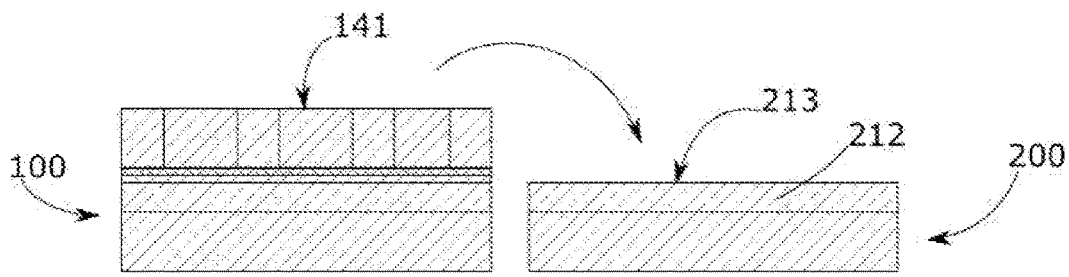
FIG. 9 represents a step of bonding the primary stack of layers with the secondary stack of layers according to an embodiment of the present invention.
Figure 10:
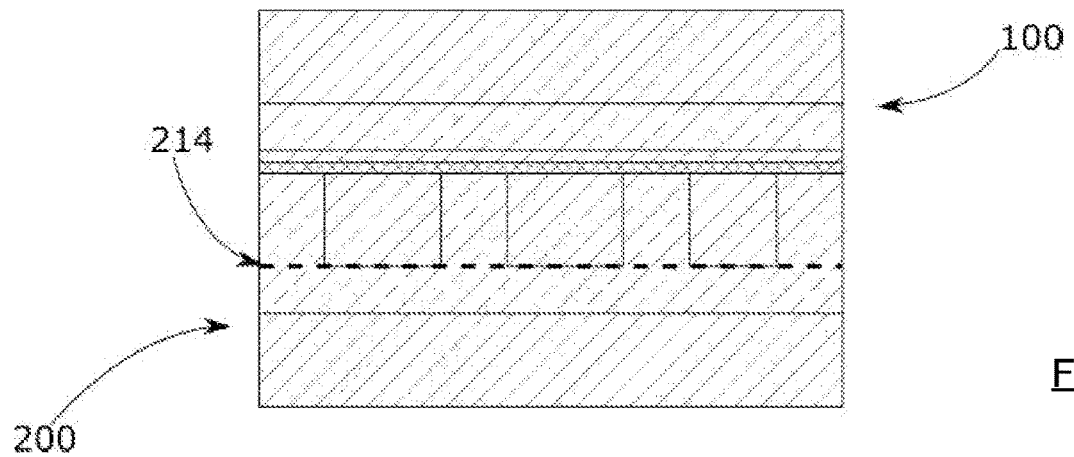
FIG. 10 represents the assembly of the primary stack of layers with the secondary stack of layers according to one embodiment of the present invention.

FIGS. 9 and 10 illustrate the bonding 1060 of at least one portion of the planarised surface 141 of the first encapsulation layer 140 with the exposed surface 213 of the transfer layer 212 of the secondary layer stack 200. This bonding is advantageously a molecular bonding. It will be noted that this bonding gives rise to a bonding interface 214. This bonding interface 214 can be either located between the previously exposed surface of a pad 131, 132 or 133 and the exposed surface 213 of the support layer 212 and/or between a portion of the planarised surface 141 of the first encapsulation layer 140 and the exposed surface 213 of the support layer 212.

Figure 11:
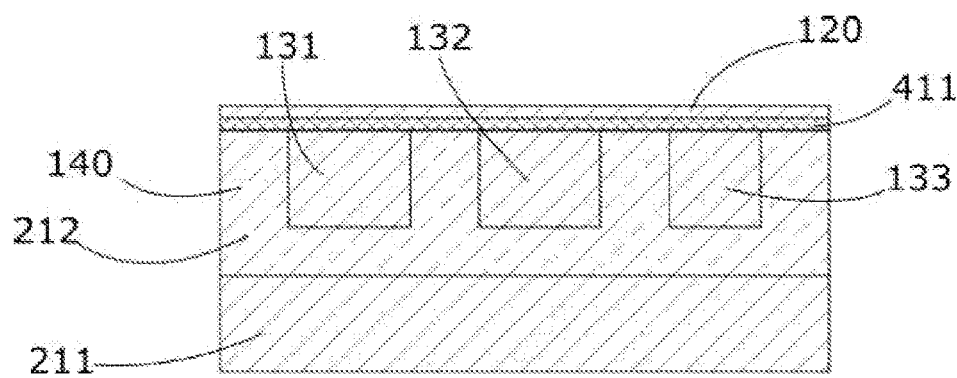
FIG. 11 represents the removal of the first substrate from the primary stack of layers according to an embodiment of the present invention.

FIG. 11 illustrates the step 1070 of removing the first substrate 110. This removal step 1070 may comprise a step of etching selectively at the monocrystalline layer 120. This step allows exposing the monocrystalline layer 120.

Now, the monocrystalline layer 120 is disposed above the interlayer 411, itself at least partially disposed above the three pads 131, 132 and 133, the whole being supported by the secondary stack of layers 200.

FIGS. 12 to 15 illustrate the conformation of the monocrystalline layer 120 into an anchoring portion 412 and into a movable portion 413 of the movable electrode 410.

Figure 12:
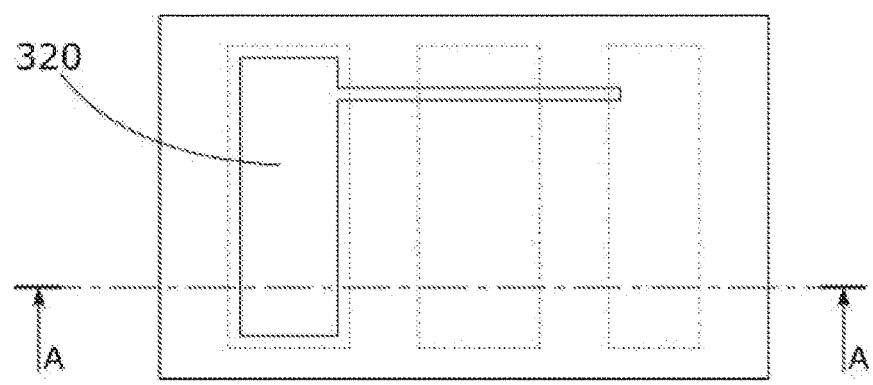
FIG. 12 represents a top view of FIG. 11 with the arrangement of a second etching mask on the monocrystalline layer according to an embodiment of the present invention.

FIG. 12 represents a top view of the arrangement on the monocrystalline layer 120 and of the conformation of a second etching mask 320 so as to define the desired geometric shape for the movable electrode 410.

Figure 13:
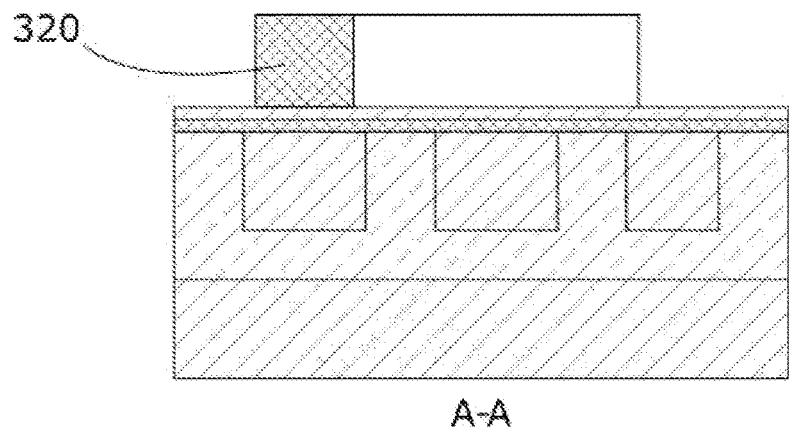
FIG. 13 represents a sectional view of FIG. 12 and the step of arranging the second etching mask on the monocrystalline layer according to an embodiment of the present invention.

FIG. 13 illustrates a sectional view of this arrangement and of this conformation.

Figure 14:
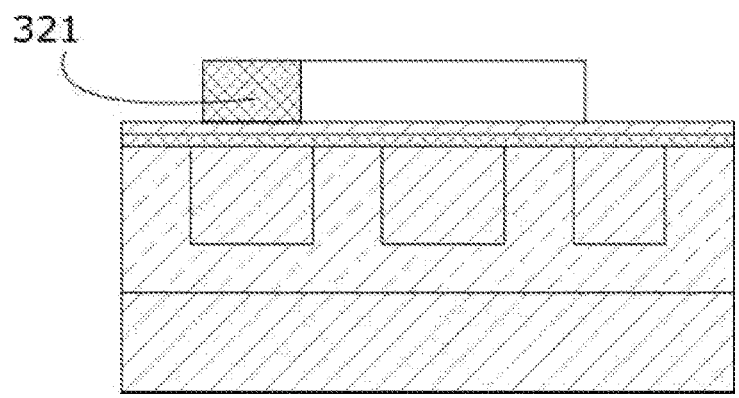
FIG. 14 represents a step of shaping the second etching mask so as to define the peripheries of the movable electrode being formed according to an embodiment of the present invention.

FIG. 14 represents an optional step consisting in refining the geometry of the second etching mask 320. This allows optimising the desired geometric shape for the movable electrode 410.

Figure 15:
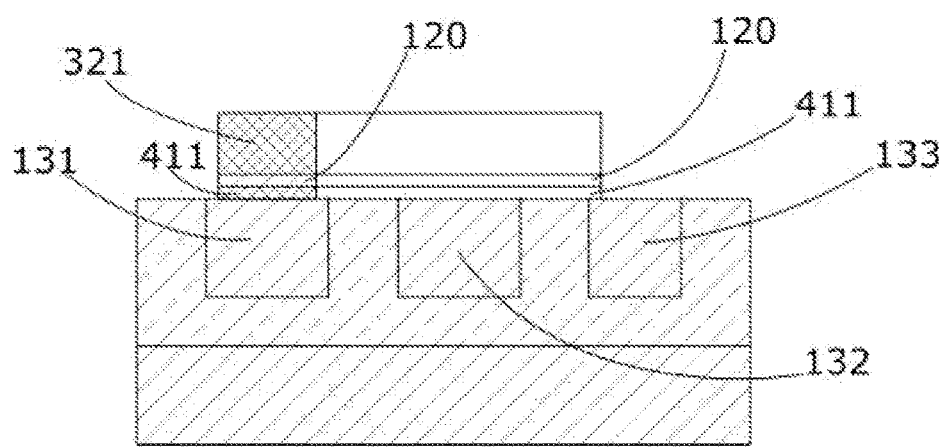
FIG. 15 represents a step of etching a portion of the monocrystalline layer and of the interlayer according to an embodiment of the present invention.

FIG. 15 illustrates the formation 1080 of the anchoring portion 412 and of the movable portion 413 of the movable electrode 410. This forming step 1080 comprises the etching of at least one portion of the monocrystalline layer 120 and preferably of at least one portion of the interlayer 411, preferably selectively at the second etching mask 320. This etching preferably continues until exposing at least one portion of the pads 131, 132 and 133 and advantageously of the first encapsulation layer 140 located between the pads 131, 132 and 133.

This etching step can be carried out by plasma etching in the presence of $Cl_2$/HBr chemistry, for example, and can be continued until exposing at least one portion of the first encapsulation layer 140.

Figure 16:
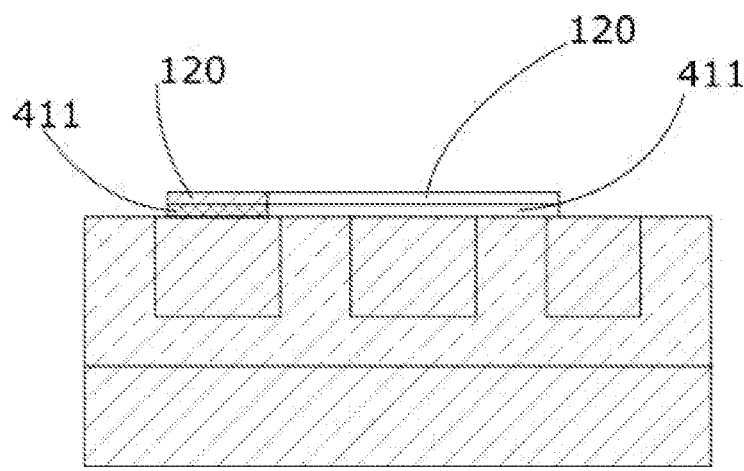
FIG. 16 represents a step of removing the second etching mask according to an embodiment of the present invention.

FIG. 16 illustrates the removal of the second etching mask 320. It is then noted that the monocrystalline layer 120 is shaped according to the desired geometry for the first electrode 410. The monocrystalline layer 120 is supported by a portion of the interlayer 411. The monocrystalline layer 120 comprises the anchoring portion 412 securing it to the first pad 131 through a support portion of the interlayer 411 and a movable portion 413, preferably longitudinal, intended to be suspended above a portion of the second pad 132 and the third pad 133.

In FIG. 16, the portion 413 intended to be suspended is for the moment supported by a sacrificial portion 414 of the interlayer 411.

Figure 17:
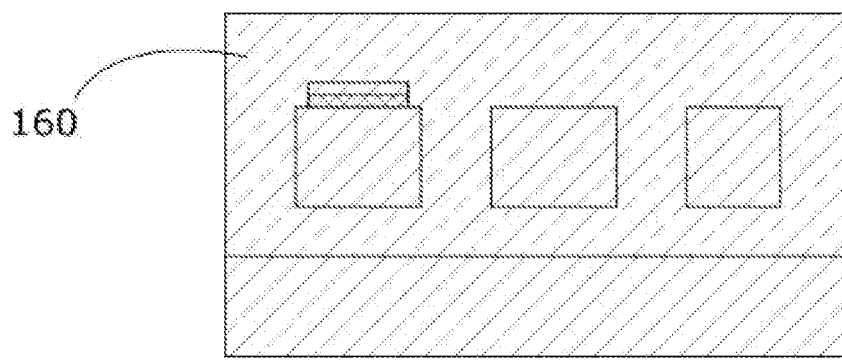
FIG. 17 represents a step of encapsulating the movable electrode according to an embodiment of the present invention.

FIG. 17 illustrates a step of encapsulating the monocrystalline layer 120 by a second encapsulation layer 160. This second encapsulation layer 160 being preferably based on a dielectric material and preferably on silicon oxide.

Figure 18:
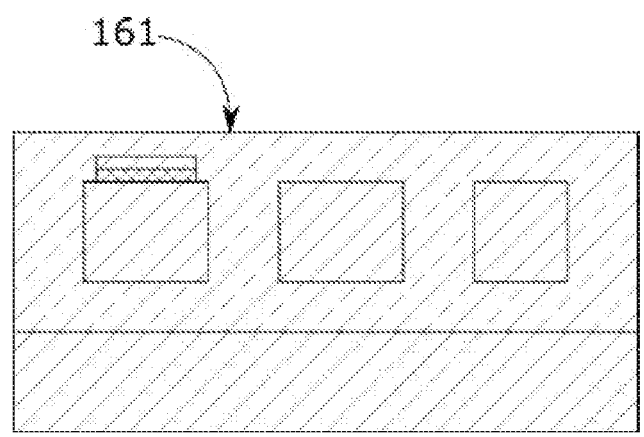
FIG. 18 represents a step of planarising the encapsulation layer according to an embodiment of the present invention.

FIG. 18 illustrates an optional step of planarising the exposed surface 161 of the second encapsulation layer 160. This planarisation is advantageously carried out by a chemical mechanical planarisation technique.

Figure 19:
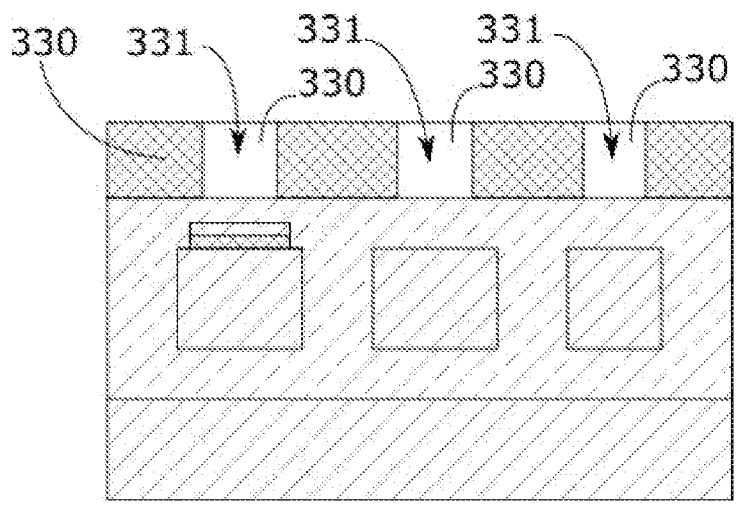
FIG. 19 represents a step of forming openings in a third etching mask directly below the three pads according to one embodiment of the present invention.

FIG. 19 represents the arrangement of a third etching mask 330 and the formation in this third etching mask 330 of openings 331, preferably disposed directly below the pads 131, 132 and 133.

Figure 20:
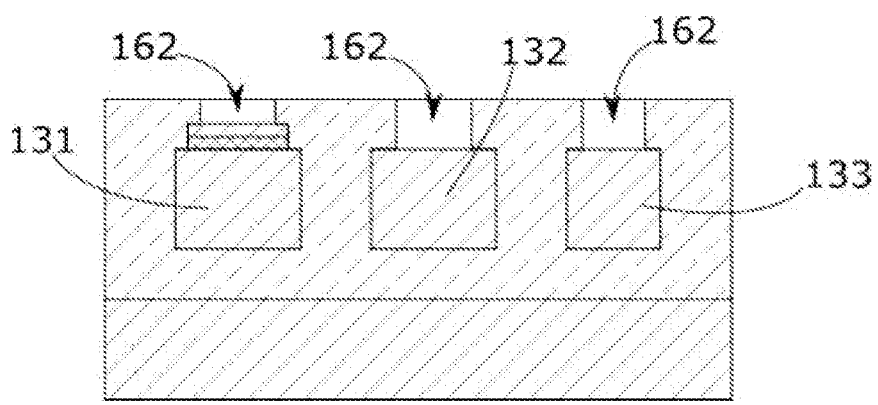
FIG. 20 represents a step of forming openings in the second encapsulation layer according to an embodiment of the present invention.

FIG. 20 then represents the etching of the second encapsulation layer 160 at each of the openings 331 formed directly below the pads 131, 132 and 133. This etching step allows defining openings 162 in the second encapsulation layer 160 directly below each pad 131, 132 and 133 and so as to expose at least one portion of each pad 131, 132 and 133.

Figure 21:
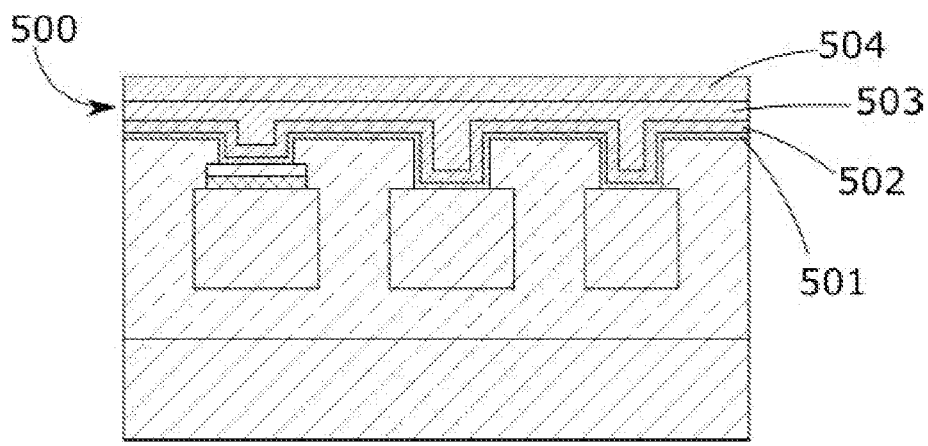
FIG. 21 represents a step of depositing a plurality of electrically conductive layers according to an embodiment of the present invention.
Figure 22:
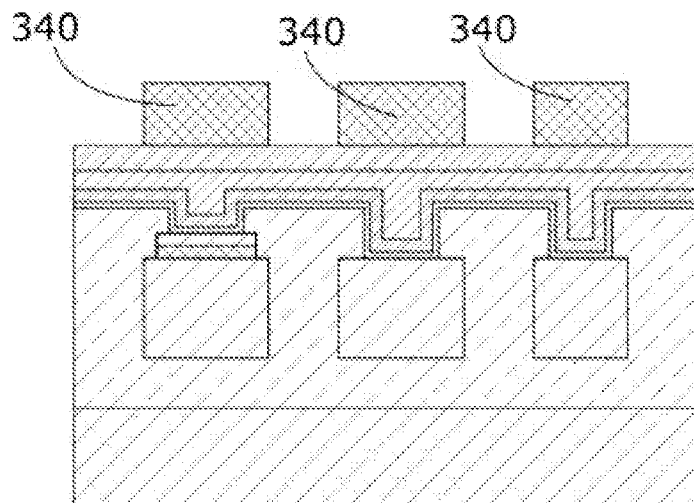
FIG. 22 represents the deposition of a fourth etching mask according to an embodiment of the present invention.
Figure 23:
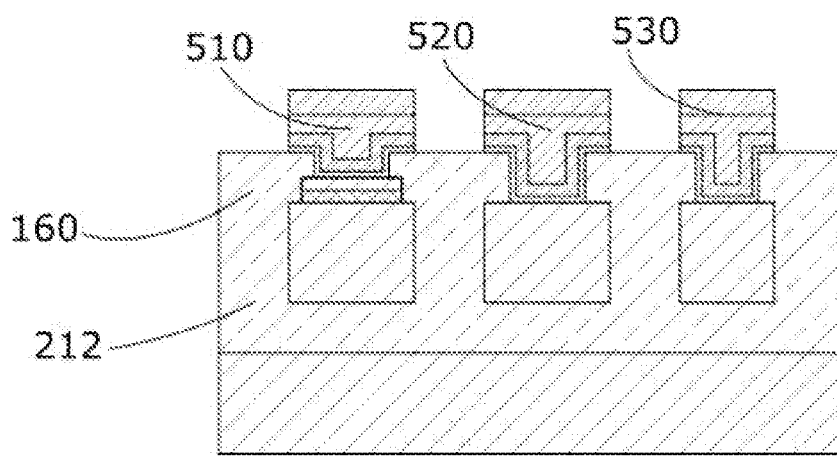
FIG. 23 represents the formation of three electrical contacts according to an embodiment of the present invention.

FIGS. 21 to 23 illustrate the steps of forming 1110 electrical contacts 510, 520 and 530. Each pad 131, 132 and 133 thus comprises an electrical contact 510, 50 and 530 configured to allow a bias, by means of the actuation electrode 420, of the movable electrode 410 and its electrical contact with the fixed contact electrode 430.

FIG. 21 represents the deposition of a metallisation layer 500 on at least one portion of the surface of the device 10 during manufacture, the objective herein being to fill the openings 161 which are previously made in the second encapsulation layer 160 by at least one portion of this metallisation layer 500.

Preferably, this metallisation layer 500 comprises a plurality of sublayers 501, 502, 503 and 504. The first sublayer 501 is for example based on titanium, the second sublayer 502 is for example based on titanium nitride, the third sublayer 503 is for example based on tungsten and the fourth sublayer 504 is based on a mixture of aluminium and silicon.

FIG. 22 represents the positioning of a fourth etching mask 340 on the metallisation layer 500 directly below the pads 131, 132 and 133.

Then FIG. 23 represents the step of etching the metallisation layer 500 selectively at the second encapsulation layer 160 so as to define at least one electrical contact 510, 520 and 530 for each pad 131, 132 and 133.

Figure 24:
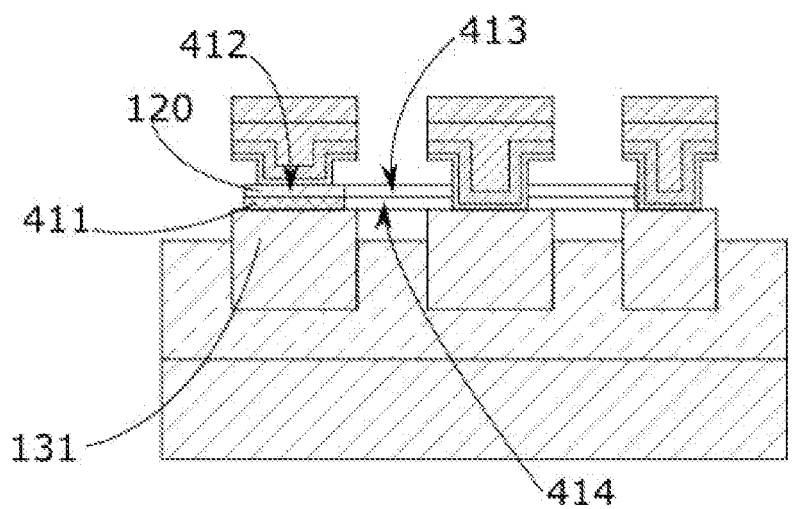
FIG. 24 represents a step of removing at least one portion of the second encapsulation layer according to an embodiment of the present invention.

FIG. 24 then illustrates a step of removing at least one portion of the thickness of the second encapsulation layer 160. This etching step may comprise a vapor phase etching, in HF chemistry for example. This etching is advantageously selective relative to the pads 131, 132 and 133, at the movable electrode 410 and at the interlayer 411.

This etching step allows exposing a surface of the interlayer 411, a surface opposite to the surface of the residual portion of the second encapsulation layer 160.

FIG. 25 then illustrates the removal 1100 of the sacrificial portion 414 of the interlayer 411, that is to say the etching of the portion of the interlayer 411 securing the movable portion 413 of the movable electrode 410 with the second pad 132 and with the third pad 133.

This etching is advantageously a wet or anhydrous etching. The objective of such an etching is to be able to remove the sacrificial portion 414 of the interlayer 411 without leaving any trace of said interlayer 411 under the movable portion 413 of the movable electrode 410, while maintaining a portion of this interlayer 411 under the anchoring portion 412 of the movable electrode 410.

Indeed, the beam defining the movable portion 413 of the movable electrode 410 is then disposed in suspension by removing the sacrificial portion 414 of the interlayer 411. This then creates the previously discussed gap 415.

According to one embodiment, this etching is a plasma etching based on CF4.

According to another embodiment, this etching is a vapor phase etching based on HCl.

It will be noted that only the sacrificial portion 414 of the interlayer 411, that is to say the portion located in contact, and preferably under, the movable portion 413 of the movable electrode 410 is removed, preferably entirely. A portion of the interlayer 411 remains under the anchoring portion 412 of the movable electrode 410, mechanically and electrically connecting it to the first pad 131 and therefore to the electrical contact 510 of the first pad 131.

Figure 26:
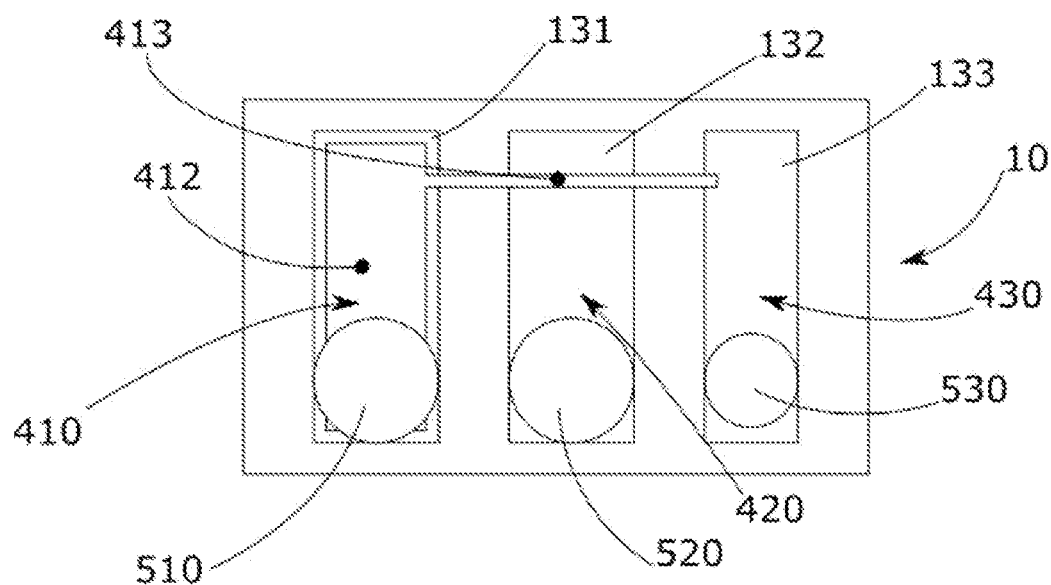
FIG. 26 represents a top view of a nano-electromechanical actuator according to an embodiment of the present invention.

FIG. 26 represents a top view of the actuator 10 of FIG. 1 made by the previously described method 1000. It will be noted that the shape of the movable portion 413 of the movable electrode 410 which extends longitudinally so as to be suspended above the other two electrodes 420 and 430.

This method 1000 thus allows obtaining a nano-electromechanical actuator 10 having an increased electromechanical response and an extremely small gap 415 relative to the prior art.

Figure 27:
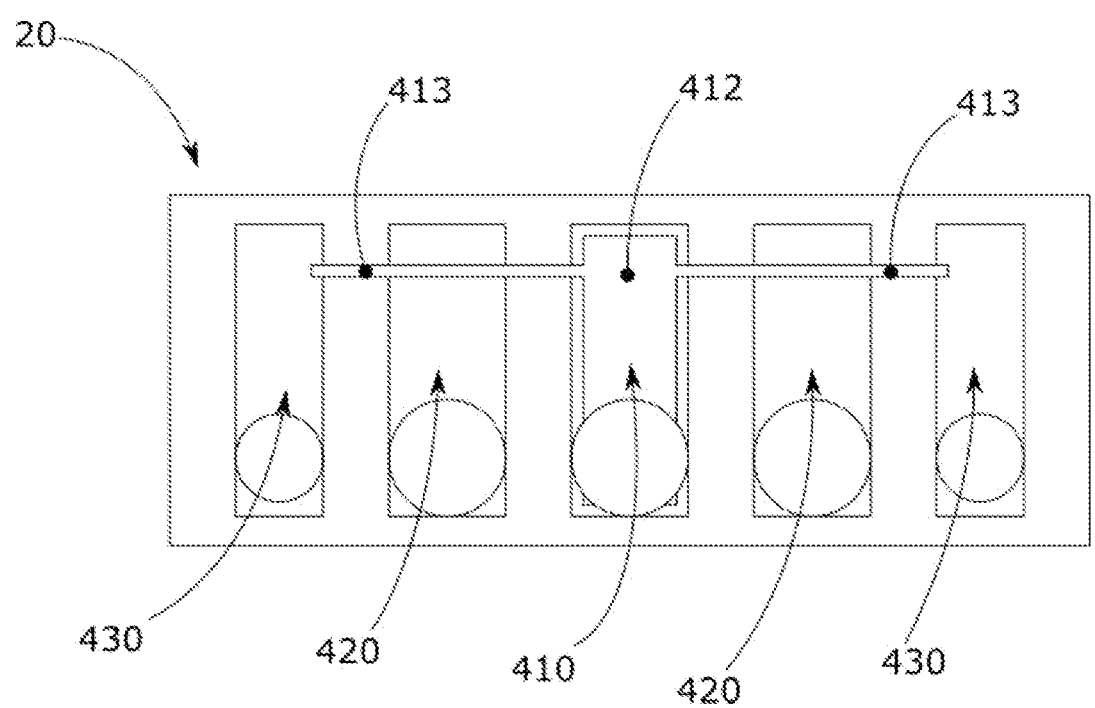
FIG. 27 represents a top view of a dual nano-electromechanical actuator according to another embodiment of the present invention.

According to an embodiment illustrated in FIG. 27, it is also possible, via this same method, to make a plurality of actuators 10. In FIG. 27, it is a dual actuator 20 comprising two movable portions 413 to each other by the same anchoring portion 412. In this Figure, there are then two fixed contact electrodes 430 and two fixed actuation electrodes 420.

According to one embodiment, and in particular depending on the thickness of the movable electrode 410 and the mechanical properties of the interlayer 411, the first movable portion 413 and the second movable portion 413 can either be independent of each other in the position thereof, or be anti-correlated with each other, such that when one is in the contact position, the other is necessarily in the rest position, for example.

The present invention thus allows a significant gain in reliability, reproducibility and longevity by making a monocrystalline movable electrode suspended at a very short distance above the fixed contact and actuation electrodes relative to the prior art.

The invention is not limited to the previously described embodiments and extends to all embodiments covered by the claims.

LIST OF REFERENCES

10 Nano-electromechanical actuator
20 Dual nano-electromechanical actuator
100 Primary stack of layers
110 First substrate
111 Support layer
112 Surface layer
120 Monocrystalline layer
130 Etching layer
131 First pad
132 Second pad
133 Third pad
140 First encapsulation layer
141 Planarised surface of the first encapsulation layer
160 Second encapsulation layer
161 Planarised surface of the second encapsulation layer
162 Openings in the second encapsulation layer
200 Secondary stacking of layers
211 Second substrate
212 Transfer layer
213 Exposed surface of the transfer layer
214 Bonding interface
310 First etching mask
320 Second etching mask
321 Second refined etching mask
330 Third etching mask
331 Openings in the third etching mask
340 Fourth etching mask
410 Movable electrode
411 Interlayer
412 Anchoring portion
413 Movable portion
414 Sacrificial portion of the interlayer
415 Gap
420 Fixed actuation electrode
430 Fixed contact electrode
500 Metallisation layer
501 First metallisation sublayer
502 Second metallisation sublayer
503 Third metallisation sublayer
504 Fourth metallisation sublayer
510 First electrical contact
520 Second electrical contact
530 Third electrical contact
1000 Manufacturing method
1010 Providing a primary stack of layers
1020 Providing a secondary stack of layers
1030 Forming three pads in the first etching layer
1040 Encapsulating the three pads by a first encapsulation layer
1050 Planarising the exposed surface of the first encapsulation layer
1060 Assembling the primary stack of layers with the secondary stack of layers
1070 Removing the first substrate
1080 Forming, by etching, the movable electrode in the monocrystalline layer
1090 Removing a portion of the interlayer
1100 Removing a sacrificial portion of the interlayer
1110 Forming electrical contacts above at least one portion of each of the three pads

The invention claimed is:

1. A method for manufacturing an electromechanical actuator comprising a fixed actuation electrode, a fixed contact electrode and a movable electrode, the actuator further comprising a stack of layers, the movable electrode comprising an anchoring portion secured to the stack of layers and a movable portion configured to have a rest position and a contact position, the rest position corresponding to an absence of contact between the movable portion of the movable electrode and the fixed contact electrode, the contact position corresponding to a contact between the movable portion of the movable electrode and the fixed contact electrode when a non-zero bias is applied between the movable electrode and the fixed actuation electrode, said method comprising:
  providing a primary stack of layers comprising:
    a first substrate;
    a monocrystalline layer disposed on an upper surface of the first substrate;
    an interlayer disposed on an upper surface of the monocrystalline layer;
    an etching layer disposed on an upper surface of the interlayer;
  providing a secondary stack of layers comprising:
    a second substrate;
    a transfer layer disposed on an upper surface of the second substrate;
  forming by etching, in the etching layer, at least three pads selectively at the interlayer;
  encapsulating the three pads by a first encapsulation layer;
  assembling the primary stack of layers with the secondary stack of layers by bonding at least one portion of an exposed surface of the first encapsulation layer with at least one portion of the exposed surface of the transfer layer so as to form a bonding interface;
  removing the first substrate;
  forming by etching the anchoring portion and the movable portion of the movable electrode in the monocrystalline layer;
  removing a sacrificial portion of the interlayer to release the movable portion of the movable electrode and so as to preserve a portion of the interlayer between the anchoring portion of the movable electrode and at least one portion of one of the three pads.

2. The method according to claim 1, wherein the monocrystalline layer comprises at least one material taken from: a semiconductor, an electrical conductor.

3. The method according to claim 1 wherein the etching layer is a monocrystalline layer.

4. The method according to claim 3, wherein the crystal structure of the monocrystalline layer is different from the crystal structure of the etching layer.

5. The method according to claim 1, wherein the monocrystalline layer and the etching layer are based on the same material.

6. The method according to claim 1, wherein the etching layer is obtained by epitaxial growth of a material identical to the material composing the monocrystalline layer and from the interlayer.

7. The method according to claim 1, wherein the interlayer has a thickness dimension which is less than or equal to the thickness dimension of the monocrystalline layer, the thickness dimensions being taken according to an axis orthogonal to the main extension dimension of the considered layers.

8. The method according to claim 1, wherein the monocrystalline layer is based on monocrystalline silicon, the interlayer is based on silicon and germanium and the etching layer is silicon-based.

9. The method according to claim 1, wherein the bonding is a molecular bonding.

10. The method according to claim 1, comprising, before the assembly step, a step of planarizing the exposed surface of the first encapsulation layer so as to at least partially expose one surface of at least one of the three pads and wherein the bonding interface is at least partially formed of one portion of the surface one of the three pads at least one portion of the exposed surface of the first encapsulation layer and at least one portion of the exposed surface of the transfer layer.

11. The method according to claim 1, wherein the step of removing a portion of the interlayer comprises at least one wet or anhydrous etching configured to remove a sacrificial portion of the interlayer supporting the movable portion of the movable electrode.

12. The method according to claim 1, comprising a step of forming at least one electrical contact for each pad.

* * * * *